(12) United States Patent
Janarthanam et al.

(10) Patent No.: US 9,730,341 B2
(45) Date of Patent: Aug. 8, 2017

(54) HYBRID ELECTRIC VEHICLE BATTERY COVER WITH ELECTRICAL DISCONNECT

(71) Applicant: FORD GLOBAL TECHNOLOGIES, LLC, Dearborn, MI (US)

(72) Inventors: Suriyaprakash Ayyangar Janarthanam, Westland, MI (US); Saravanan Paramasivam, South Lyon, MI (US); Patrick Daniel Maguire, Ann Arbor, MI (US); John Peter Bilezikjian, Canton, MI (US); Jason C. Marcath, Dearborn, MI (US); Debbi Callicoat, Livonia, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1014 days.

(21) Appl. No.: 14/014,565

(22) Filed: Aug. 30, 2013

(65) Prior Publication Data

US 2015/0061413 A1    Mar. 5, 2015

(51) Int. Cl.
*F16P 3/20*        (2006.01)
*H05K 5/02*      (2006.01)
*H01M 2/10*      (2006.01)

(52) U.S. Cl.
CPC ........ *H05K 5/0208* (2013.01); *H01M 2/1083* (2013.01); *H01M 2200/20* (2013.01)

(58) Field of Classification Search
CPC .............. H05K 5/0208; H01M 2/1083; H01M 2200/20; H01M 2/34; H02J 7/0045; H02J 7/0044; Y02E 60/12

USPC ....... 307/9.1, 10.1, 10.7, 328; 320/107, 110, 320/112, 114, 115; 200/43.01, 43.09; 439/310; 337/194, 196
See application file for complete search history.

(56) References Cited

U.S. PATENT DOCUMENTS

| | | | |
|---|---|---|---|
| 5,389,462 A * | 2/1995 | Lin ....................... | H01M 2/043 429/121 |
| 7,692,401 B2 | 4/2010 | Gonzales et al. | |
| 2009/0051226 A1* | 2/2009 | Marukawa ............ | B60L 3/0046 307/328 |
| 2009/0053588 A1* | 2/2009 | Marukawa .......... | H01M 2/1072 429/97 |
| 2009/0236162 A1* | 9/2009 | Takasaki .................. | B60K 1/04 180/68.5 |
| 2011/0043999 A1* | 2/2011 | Johnston ................... | B03C 3/68 361/699 |
| 2011/0068622 A1 | 3/2011 | Ikeno et al. | |
| 2011/0127855 A1* | 6/2011 | Kim ........................ | H01M 2/34 307/326 |

(Continued)

*Primary Examiner* — Rexford Barnie
*Assistant Examiner* — Rasem Mourad
(74) *Attorney, Agent, or Firm* — David B. Kelley; Brooks Kushman P.C.

(57) ABSTRACT

A battery system includes a battery cover, a battery access panel removably connected to the battery cover, and a service disconnect switch. The service disconnect switch includes an electrical interlock switch. The service disconnect switch has a first position cooperating with the battery access panel to prevent removal of the access panel from the battery cover. In the first position, the service disconnect connects a traction battery to circuitry. The service disconnect also has a second position, the second position being displaced from the access panel and disconnecting the battery.

9 Claims, 5 Drawing Sheets

(56) References Cited

U.S. PATENT DOCUMENTS

| | | | |
|---|---|---|---|
| 2012/0052346 A1* | 3/2012 | Kruger | B60L 3/0007 |
| | | | 429/65 |
| 2013/0030621 A1 | 1/2013 | Chung et al. | |
| 2013/0288086 A1* | 10/2013 | Kim | H01M 2/34 |
| | | | 429/61 |
| 2014/0162497 A1* | 6/2014 | Lim | B60L 3/04 |
| | | | 439/620.26 |
| 2015/0069835 A1* | 3/2015 | Colchen | H01H 85/545 |
| | | | 307/10.7 |

* cited by examiner

HYBRID ELECTRIC VEHICLE BATTERY COVER WITH ELECTRICAL DISCONNECT

TECHNICAL FIELD

This disclosure relates to covers for high voltage vehicle batteries to limit high voltage exposure.

BACKGROUND

Hybrid electric vehicles make use of a drive motor in addition to an internal combustion engine. Such vehicles are equipped with a high voltage battery to supply power to the drive motor. In certain situations, exposure to high voltage access points should be limited.

SUMMARY

A battery system includes a battery cover, a battery access panel removably connected to the battery cover, and a service disconnect switch. The service disconnect switch includes an electrical interlock switch. The service disconnect switch has a first position cooperating with the battery access panel to prevent removal of the access panel from the battery cover. In the first position, the service disconnect connects a traction battery to circuitry. The service disconnect also has a second position, the second position being displaced from the access panel and disconnecting the battery.

The battery system may include an external cable connection point for the traction panel. The external cable connection point is covered by the access panel when the access panel is connected to the battery cover, wherein the battery is connected to external cable connection point when the service disconnect switch is in the first position and disconnected from the external cable connection point when the service disconnect is in the second position. The access panel may have a flange extending from an exterior face, and the service disconnect switch may have an interior face positioned to abut the flange and prevent removal of the access panel when the service disconnect is in the first position. The access panel may additionally have at least one fastening point for connection to the battery cover. The service disconnect switch may have a body and a pivotable member pivotally and slidably coupled to the body. The pivotable member is connected to the interlock switch and is slidable along an axis of the service disconnect body to engage the electrical interlock switch with a corresponding interlock or disengage the switch from the interlock. The pivotable member is also pivotable about a pivot axis that is normal to the body axis to prevent or enable removal of the access panel from the battery cover.

A method for accessing an electrical connection point of a traction battery, where the battery is retained within a battery cover with a removable access panel and the panel is retained against the battery cover by a service disconnect, includes sliding a pivot arm of the service disconnect along an axis that is generally parallel to a face of the battery cover to disconnect the traction battery from the electrical connection point. The method additionally includes pivoting the pivot arm to release a flange of the access panel. The method further includes removing the access panel to expose the electrical connection point.

The method may further include removing the service disconnect. The method may additionally include replacing the access panel against the battery cover to cover the electrical connection point, replacing the service disconnect, pivoting the pivot arm to engage the flange of the access panel, and sliding the pivot arm to connect the battery. In one embodiment, the access panel has at least one fastening point point and a fastener connecting the fastening point to the battery cover. In this embodiment, removing the access panel includes removing the fastener to disconnect the access panel from the battery cover.

A traction battery system for a hybrid electric vehicle includes a traction battery having a battery connection point, a battery cover retaining the battery, an access panel that is removably connected to the battery cover, and a service disconnect. The access panel is positioned to cover the battery connection point. The access panel has a flange extending from an exterior surface. The service disconnect has first and second positions. In the first position, the service disconnect is electrically engaged with a circuit to connect the battery to the battery connection point and mechanically engaged with the access panel. In this position, an interior face of the service disconnect retains the flange to hold the access panel against the battery cover. In the second position, the service disconnect is disengaged from the circuit to disconnect the battery from the circuit and disengaged from the access panel.

In one embodiment, the service disconnect includes a body and a pivotable member that is pivotally and slidably coupled with the body. The pivotable member includes an interlock switch. In such an embodiment, in the first position the pivotable member is engaged with the flange and the interlock switch is engaged with a corresponding interlock to electrically connect the battery with the battery connection point. In the second position the pivotable member is disengaged from the flange and the interlock switch is disengaged from the interlock to electrically disconnect the battery from the battery connection point. In a variant embodiment, in the second position the pivotable member is laterally displaced to disengage the interlock switch from the interlock and pivoted relative to the body to disengage the pivotable member from the flange. In one embodiment the access panel has at least one fastening point for connection to the battery cover. The fastening point is configured to retain the battery cover to a battery tray when the access panel is installed and fastened to the battery cover.

Embodiments according to the present disclosure provide a number of advantages. For example, the present disclosure provides a service disconnect that mechanically retains an access panel covering battery connection points, limiting access to high voltage connections. In order to remove the access panel and access the battery connection points, the service disconnect is removed, electrically disconnecting the battery from the connection points.

The above advantage and other advantages and features of the present disclosure will be readily apparent from the following detailed description of the preferred embodiments when taken in connection with the accompanying drawings.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
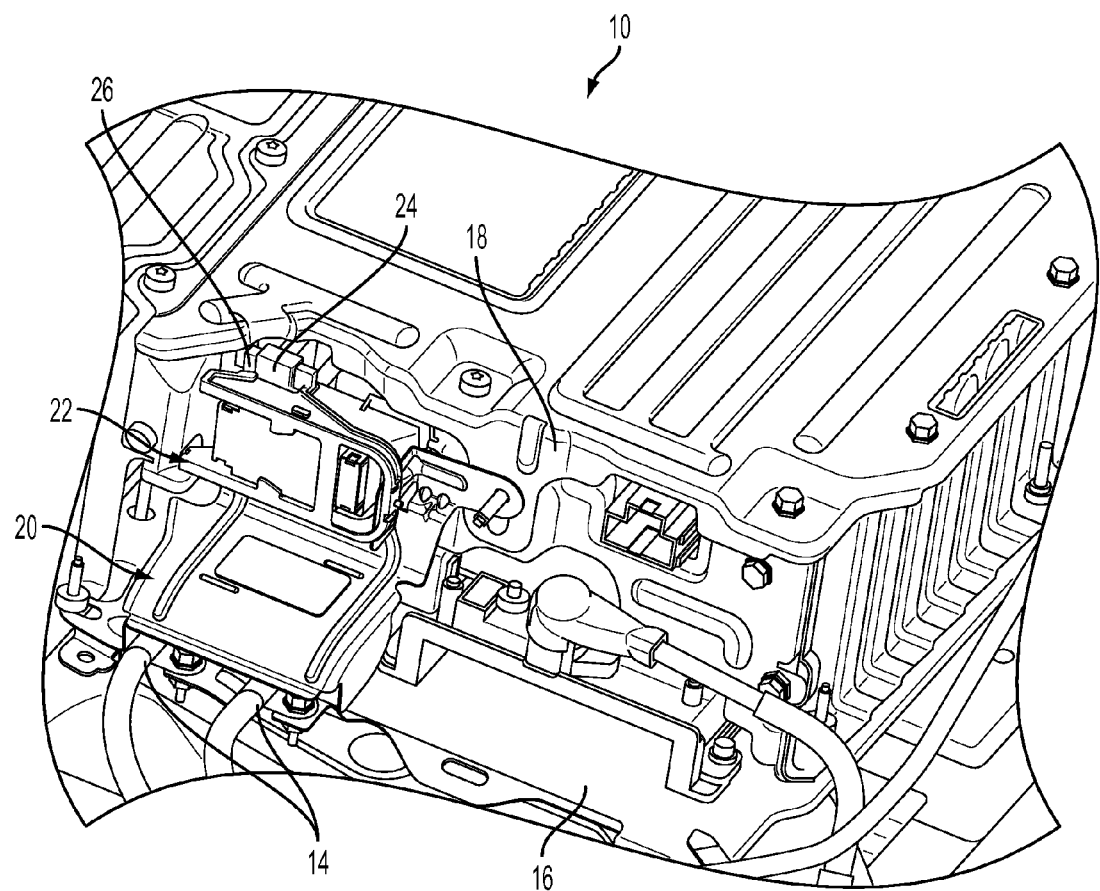
FIG. 1 illustrates an embodiment of a battery cover system.
Figure 2:
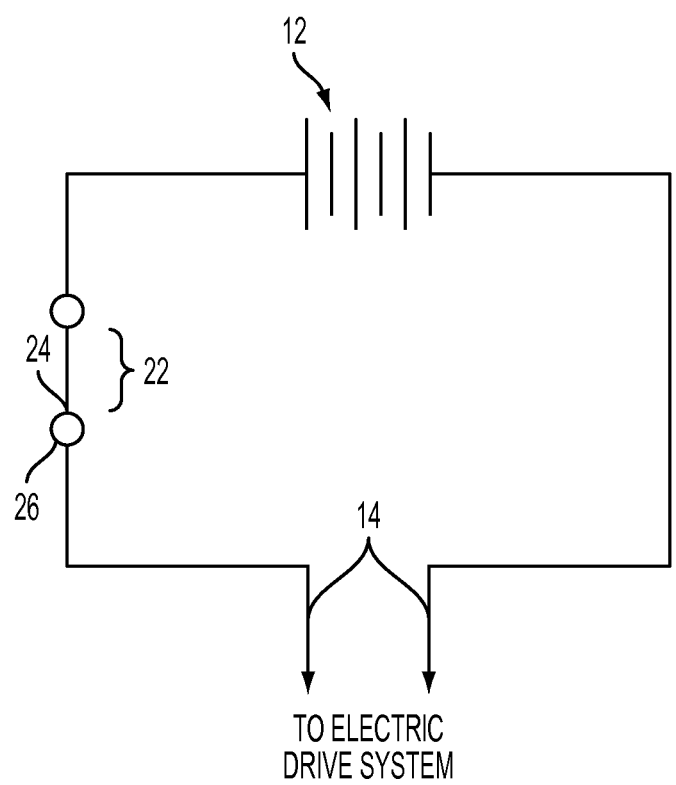
FIG. 2 illustrates an embodiment of a circuit including a high voltage battery, an electrical interlock, and battery connection points.

With reference to FIGS. 1 and 2, a battery cover system 10 according to the present disclosure is illustrated. The system 10 includes a high voltage battery 12 that is electrically connected to battery connection points 14. The battery is disposed on a battery tray 16 and retained within a battery cover 18. The battery system 10 additionally includes an access panel 20. Access panel 20 is removably connected to battery tray 16 and battery cover 18. Access panel 20 is arranged to cover terminals 14. When connected to battery tray 16 and/or battery cover 18, access panel 20 prevents user access to terminals 14. The battery system further includes a service disconnect switch 22, which may also be referred to a service disconnect or a disconnect switch. Service disconnect 22 has an interlock switch 24 configured to interface with interlock 26. Interlock 26 is electrically connected in circuit with battery 12 and battery connection points 14.

Service disconnect 22 acts as a mechanical and electrical interlock in the battery cover system. When service disconnect 22 is installed and switch 24 is engaged with interlock 26, battery 12 is electrically connected to connection points 14. Battery connection points 14 may in turn be electrically connected to an electric drive system. Thus when service disconnect 22 is installed, the high voltage battery 12 may provide power to an electric drive system. Additionally, when switch 24 is interfaced with interlock 26, service disconnect 22 retains access panel 20 against battery cover 18. The retention mechanism will be explained in further detail in conjunction with FIGS. 3-5. When service disconnect 22 is removed, switch 24 is disengaged from interlock 24, electrically disconnecting the battery from connection points 14.

Figure 3:
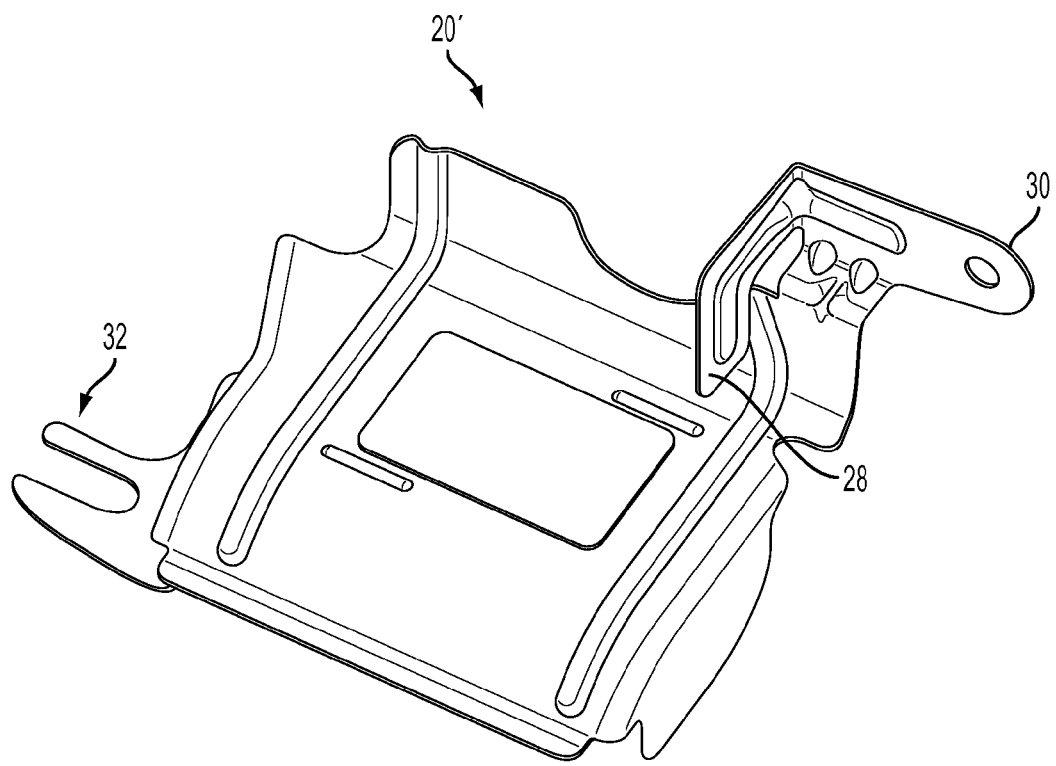
FIG. 3 illustrates an embodiment of a battery access panel.

With reference to FIG. 3, an embodiment of an access panel 20' according to the present disclosure is illustrated. Access panel 20' has an interior face adapted to interface with a battery cover. A flange 28 extends from an exterior face of access panel 20'. In this embodiment, flange 28 is L-shaped. Other shapes and configurations are, of course, possible. Access panel 20' further includes a first fastening point 30 and a second fastening point 32. First fastening point 30 is positioned to receive a fastener for connection to a battery cover. Second fastening point 32 is positioned to receive a fastener for connection to a battery tray. In this embodiment, fastening points 30 and 32 are adapted to receive studs or bolts. Other appropriate fasteners may of course be used, including but not limited to screws or retaining clips. Although various fasteners may be used, when installed in a battery cover system such as illustrated in FIG. 1, access panel 20' is retained against a battery cover by a service disconnect even if fasteners are removed. In this fashion, user access to battery connection points is prevented until the service disconnect is removed.

Figure 4:
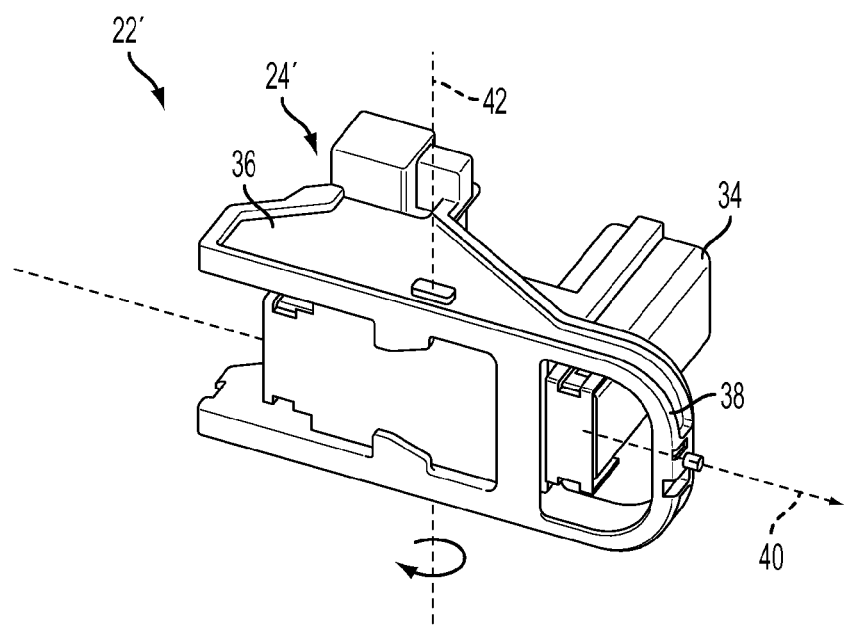
FIG. 4 illustrates an embodiment of a service disconnect.

With reference to FIG. 4, an embodiment of a service disconnect 22' according to the present disclosure is illustrated. Service disconnect 22' has a body 34 including an electrical connector (not shown in this view). Service disconnect also includes a pivotable member 36. Pivotable member 36 includes an interlock switch 24' configured to engage with an interlock. When installed in a battery cover system, switch 24' and the electrical connector complete an electrical circuit. Pivotable member 36 is slidably and pivotally connected to body 34. Pivotable member 36 is provided with a pull handle 38 to facilitate sliding and pivoting the pivotable member relative to body 34. Pivotable member 36 may slide relative to body 34 along a body axis 40 from a first station to a second station. When service disconnect 22' is installed in a battery cover system, body axis 40 is generally parallel to a face of an access panel. The first station is positioned to engage the switch 24' with an interlock. The second station is positioned to disengage switch 24' from an interlock. In the second station, pivotable member 36 may be pivoted about a pivot axis 42 to a third station. Pivot axis is normal to body axis 40. Pivoting the pivotable member 36 to the third station orients pull handle 38 to ease removal of service disconnect 22' from the battery cover system. In addition, as will be discussed below in conjunction with FIG. 5, pivoting the pivotable member to the third station may disengage the service disconnect 22' from a flange on an access panel.

Figure 5A:
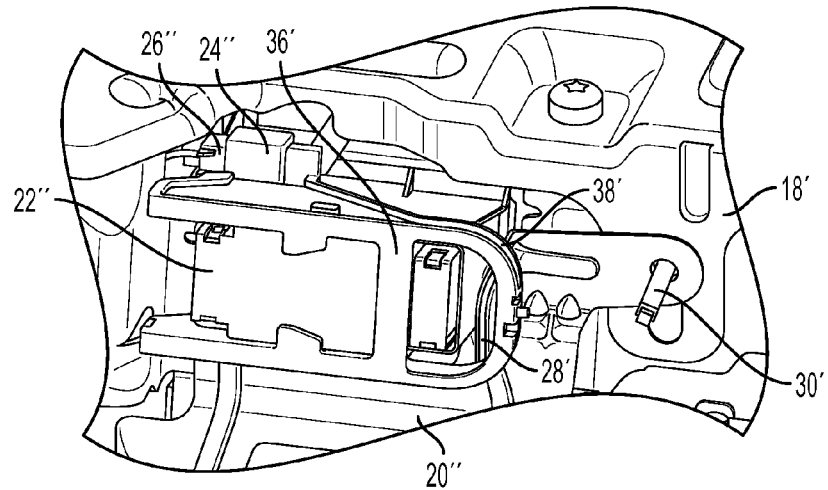
FIGS. 5a through 5c illustrate removal of a service disconnect in a battery cover system.
Figure 5B:
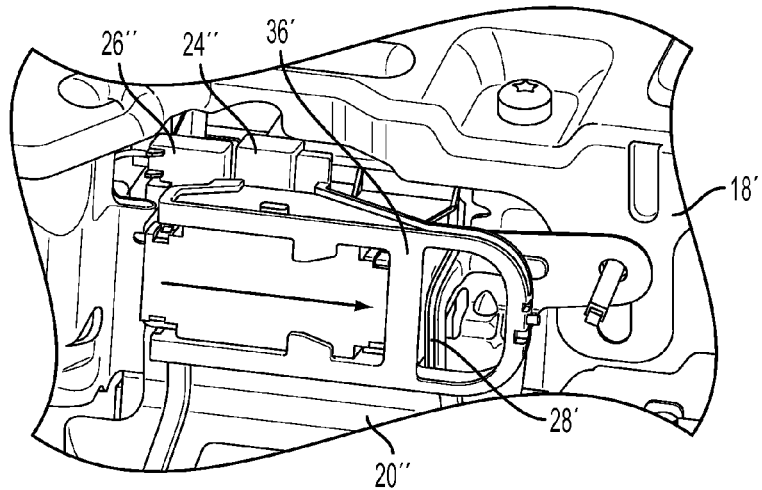
Figure 5C:
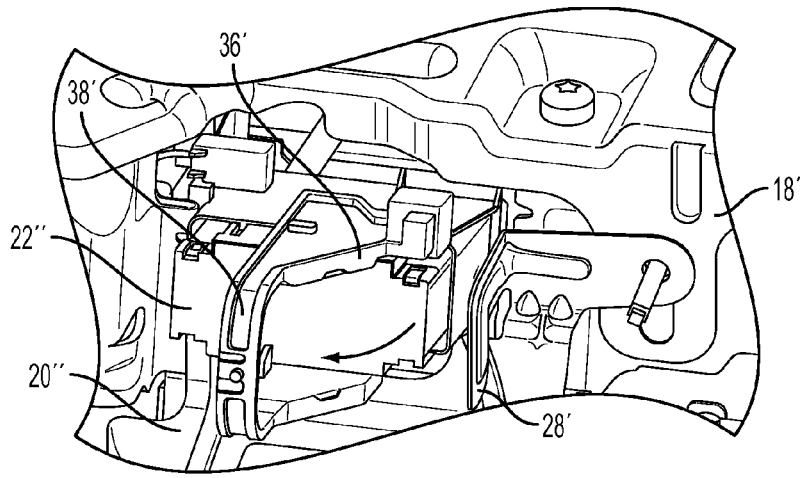

With reference to FIGS. 5a-5c, operation of a battery cover system according to the present disclosure will be described. Pivotable member 36' of service disconnect 22" is illustrated at a first station in FIG. 5a, a second station in FIG. 5b, and at a third station in FIG. 5c.

At the first station, interlock switch 24" of service disconnect 22" is engaged with interlock 26", connecting a high voltage battery to access points as described previously (not shown in this view). In addition, pull handle 38' is positioned so that an interior face abuts flange 28' of access panel 20". While positioned at the first station, service disconnect 22" thus retains access panel 20" in place against battery cover 18'. Access panel 20" may be retained by additional fasteners, such as illustrated at fastening point 30'. However, even if all additional fasteners are removed, access panel 20" is still held against battery cover 18' by service disconnect 20".

At the second station, pivotable member 36' has been slid laterally along a body axis, as illustrated by the heavy arrow. Switch 24" has been disengaged from interlock 26", breaking the electrical connection between the high voltage battery and the battery access points. Pivotable member 36' still abuts flange 28' to retain access panel 20" against battery cover 18'.

At the third station, pivotable member 36' has been pivoted about a pivot axis, as illustrated by the heavy arrow. Pivotable member 36' no longer retains flange 28' of access panel 20". Access panel 20" may be removed, enabling access to battery connection points and permitting removal of battery cover 18'. Service disconnect 22" may also be removed from the assembly by pulling straight out on pull handle 38'.

Figure 6:
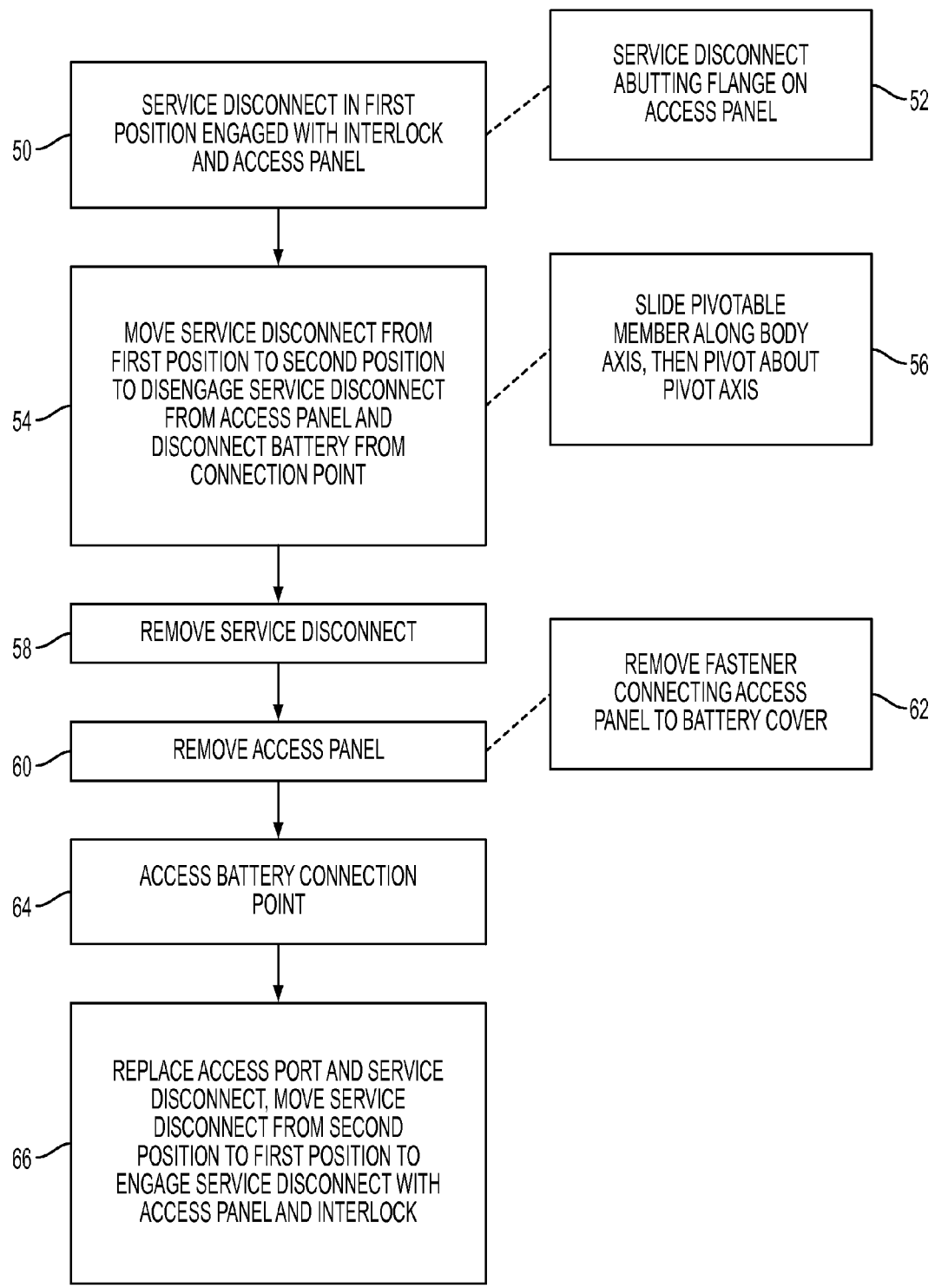
FIG. 6 is a flowchart illustrating operation of a battery cover system.

With reference to FIG. 6, a flowchart of the operation of a battery cover system according to the present disclosure is illustrated. As illustrated in block 50, a service disconnect is in a first position, engaged with an interlock to electrically connect a battery with a circuit and mechanically engaged with an access panel to retain it against a battery cover. As illustrated in block 52, this may include an inner face of the service disconnect abutting a flange extending from the access panel. The service disconnect is then moved from the first position to a second position to disengage the service disconnect from the access panel and disconnect a battery from a battery connection point, as illustrated in block 54. This may be performed by sliding a pivotable member of the service disconnect along a body axis to disengage an interlock switch from an interlock, and then pivoting the pivotable member about a pivot axis to disengage the service disconnect from the access panel, as illustrated in block 56. The service disconnect is then removed, as illustrated in block 58. The access panel is then removed to expose the terminals, as illustrated in block 60. Removing the access panel may include removing at least one fastener connecting the access panel to the battery cover, as illustrated in block 62. The battery connection point may then be accessed, as illustrated in block 64. The battery cover may also be removed to access the high voltage battery. After accessing the battery connection point and/or battery, the access port is replaced, the service disconnect is placed in the second position and then moved to the first position to re-engage the service disconnect with the access panel and interlock panel, as illustrated in block 54.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As an example, block 58 may be omitted. In such embodiments, battery disconnect may be left in place in the second disengaged position while the access panel is removed and the battery connection point is accessed.

As can be seen from the various embodiments, a service disconnect that mechanically retains an access panel covering battery connection points is provided to limit access to the traction battery. In order to access the battery connection points, the service disconnect switch must be opened, electrically disconnecting the battery from the connection points.

As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A battery system comprising:
    a battery cover;
    an access panel removably connected to the battery cover; and
    a service disconnect switch configured to be slid from a first position to a second position to disconnect a battery retained by the battery cover from terminals covered by the access panel, and rotated from the second position to a third position to release the access panel from the battery cover.

2. The battery system of claim 1, wherein the access panel has a flange extending from an exterior face, and the service disconnect switch has an interior face positioned to abut the flange and prevent removal of the access panel when the service disconnect switch is in the first position.

3. The battery system of claim 1, wherein the access panel has at least one fastening point configured to be connected to the battery cover.

4. A method for accessing terminals of a traction battery retained within a battery cover that has a removable access panel retained against the battery cover by a service disconnect, comprising:
    sliding a pivot arm of the service disconnect along an axis to disconnect the traction battery from the terminals;
    pivoting the pivot arm to release a flange of the access panel from the battery cover; and
    removing the access panel.

5. The method of claim 4, further comprising removing the service disconnect.

6. The method of claim 5, further comprising replacing the access panel against the battery cover, replacing the service disconnect, pivoting the pivot arm to engage the flange of the access panel, and sliding the pivot arm along the axis to connect the traction battery to the terminals.

7. The method of claim 4, wherein the access panel has at least one fastening point and a fastener connecting the fastening point to the battery cover, and wherein removing the access panel includes removing the fastener to disconnect the access panel from the battery cover.

8. A traction battery system for a vehicle comprising:
    a traction battery having terminals;
    a battery cover retaining the traction battery;
    an access panel removably connected to the battery cover and positioned to cover the terminals, wherein the access panel has a flange extending from an exterior surface; and
    a service disconnect electrically engaged with a circuit to electrically connect the traction battery to the terminals and mechanically engaged with the access panel such that an interior face of the service disconnect retains the flange to hold the access panel against the battery cover when in a first position, wherein the service disconnect is configured to be slid along the battery cover from the first position to a second position to disconnect the traction battery from the terminals and rotated from the second position to a third position to disengage the interior face from the flange to release the access panel from the battery cover.

9. The traction battery system of claim 8, wherein the access panel has at least one fastening point configured to be connected to the battery cover such that the battery cover is retained to a battery tray when the access panel is installed and fastened to the battery cover.

* * * * *